United States Patent [19]

Hoshino

[11] Patent Number: 5,430,258
[45] Date of Patent: Jul. 4, 1995

[54] COPPER INTERCONNECTION STRUCTURE AND METHOD OF PREPARING SAME

[75] Inventor: Kazuhiro Hoshino, Tokyo, Japan

[73] Assignee: Sony Corporation, Tokyo, Japan

[21] Appl. No.: 208,783

[22] Filed: Mar. 11, 1994

Related U.S. Application Data

[63] Continuation of Ser. No. 959,093, Oct. 9, 1992, abandoned.

[30] Foreign Application Priority Data

Oct. 9, 1991 [JP] Japan ................... 3-261631

[51] Int. Cl.⁶ .............................................. H05K 1/00
[52] U.S. Cl. ...................................... 174/250; 174/256; 174/257; 174/261; 174/262
[58] Field of Search ............... 174/250, 256, 257, 261, 174/262, 265; 257/762, 765, 771; 428/52, 630, 631, 908

[56] References Cited

U.S. PATENT DOCUMENTS

| | | | |
|---|---|---|---|
| 3,180,022 | 4/1965 | Briggs | 428/652 |
| 3,306,716 | 2/1967 | Adler | 428/652 |
| 4,109,372 | 8/1978 | Geffken | 257/765 |
| 4,500,898 | 2/1985 | Cline | 257/771 |
| 4,521,476 | 6/1985 | Asai et al. | 428/674 |
| 4,910,169 | 3/1990 | Hoshino | 437/198 |
| 4,917,963 | 4/1990 | Kittler | 428/674 |
| 4,985,750 | 1/1991 | Hoshino | 257/762 |

FOREIGN PATENT DOCUMENTS

| | | | |
|---|---|---|---|
| 62-253781 | 11/1987 | Japan | 428/652 |
| 63-88843 | 4/1988 | Japan | 428/652 |
| 63-261733 | 10/1988 | Japan | 428/652 |
| 2-206122 | 8/1990 | Japan . | |
| 20206123 | 8/1990 | Japan . | |

OTHER PUBLICATIONS

"Cu Wiring Technology to LSI device", *Semiconductor World*, Jun. 1988, pp. 89–93.

Knuyt, "Electrical Resistivity Calculations for Amorphous $Cu_xAl_{1-x}$", Phys. Stat. Sol (6) 123, (1984), pp. 763–771.

*Primary Examiner*—Leo P. Picard
*Assistant Examiner*—Cheryl R. Figlin
*Attorney, Agent, or Firm*—Hill, Steadman & Simpson

[57] ABSTRACT

A method of preparing a Cu interconnection structure includes the following steps in the sequence: (a) depositing a Cu layer on a substrate layer; (b) depositing an Al layer on said Cu layer; (c) heating said Al layer and said Cu layer at a temperature ranging from 300° C. to 550° C. so as to transform said Al layer into a layer of alloy consisting of Al and Cu; and (d) depositing an insulating layer containing $SiO_2$ on the alloy layer. Oxidation of Cu is suppressed by the formation of $Al_2O_3$ on the outer surface of the alloy layer. Therefore, increase of electrical resistance of the Cu interconnection structure is substantially suppressed.

8 Claims, 4 Drawing Sheets

COPPER INTERCONNECTION STRUCTURE AND METHOD OF PREPARING SAME

This is a continuation, of application Ser. No. 07/959,093, filed Oct. 9, 1992 now abandoned.

BACKGROUND OF THE INVENTION

1. Field of the Invention

The present invention relates to a copper interconnection structure which is used in a very large scale integrated circuit (VLSI) and a method of preparing the copper interconnection structure.

2. Description of the Prior Art

The line width of an electrode interconnection structure has recently become substantially narrower in response to the complexation of the structure of the VLSI. Hitherto, an aluminum or aluminum alloy has been used as an electrode interconnection material. However, for example, as the line width of an aluminum alloy pattern is narrowed to 0.3 μm or less, its electromigration resistance or stressmigration resistance is lowered. With this, the quality of the interconnection structure tends to be seriously deteriorated. In view of this, instead of aluminum, a metal having a high melting point such as molybdenum or tungsten has been proposed to be used as an electrode interconnection material. However, electrical resistance of molybdenum or tungsten is very high as compared with that of aluminum. Therefore, molybdenum or tungsten is not suitable for a so-called high-speed device which is requisite for the latest VLSI. Thus, as is disclosed in a monthly journal of "Semiconductor World", June, 1988 issue, 89 p–93 p, there is another proposal to use copper as an electrode interconnection material. Copper is low in electrical resistance and has a high electromigration resistance. However, copper has the following drawback.

Copper is oxidized at a temperature of about 200° C. in an atmosphere containing at least several percent of oxygen. In fact, in a wafer process such as an insulating film formation by CVD method or annealing, the patterned copper is exposed to a high temperature in an atmosphere containing oxygen. Unlike aluminum, an oxidized surface layer serving as a barrier for suppressing a further oxidation is not produced on copper. In fact, oxygen diffuses into the interior of the patterned copper so as to oxidize the same. With this, electrical resistance of the patterned copper drastically increases, thereby making copper difficult to be used as an electrode interconnection material of the VLSI.

SUMMARY OF THE INVENTION

It is therefore an object of the present invention to provide a copper interconnection structure and a method of preparing the same, in which structure a patterned copper layer is difficult to be oxidized.

According to a first aspect of the present invention, there is provided an electrical interconnection structure including: a substrate layer; a Cu layer deposited on the substrate layer; and a layer of alloy consisting of Al and Cu, the alloy layer covering the Cu layer so as to suppress oxidation of the Cu layer.

According to a second aspect of the present invention, there is provided a method of preparing an electrical interconnection structure, the method comprising the following steps in the sequence: (a) depositing a Cu layer on a substrate layer; (b) depositing an Al layer on the Cu layer; and (c) heating the Al layer and the Cu layer so as to transform the Al layer into a layer of alloy consisting of Al and Cu.

DESCRIPTION OF THE PREFERRED EMBODIMENTS

Referring to FIGS. 1–6, a method of preparing a copper interconnection structure according to a first embodiment of the present invention will be described in the following.

Figure 1:
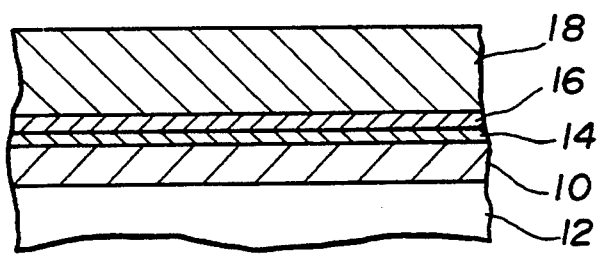
FIGS. 1 to 6 are elevational and sectional views, showing sequential steps of forming a copper interconnection structure in accordance with a first embodiment of the present invention.

As is seen from FIG. 1, firstly, a first insulating layer 10 is deposited on a silicon substrate layer 12 on which certain elements (not shown) have been formed. Then, contact holes (not shown) are formed on certain predetermined positions of the first insulating layer 10. Then, layers of Ti and TiN 14, 16 are orderly deposited on the first insulating layer 10 by a DC magnetron sputtering method, as illustrated, so as to have thicknesses of 30 nm and 100 nm, respectively. Then, a layer of Cu 18 is deposited on the layer of TiN 16 by a DC magnetron sputtering method so as to have a thickness of 500 nm. It should be noted that the layer of Ti 14 is formed for the purpose of ohmic contact, and that the layer of TiN 16 serves as a barrier to suppress the reaction between the layer of Cu 18 and the silicon substrate layer 12.

Figure 2:
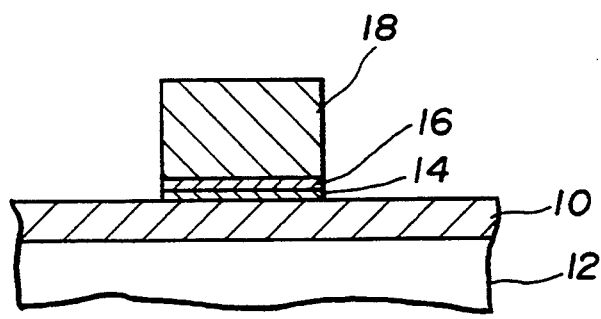

Then, the layer of Cu 18 is patterned, for example, by a reactive ion etching (RIE) method in accordance with, for example, the following conditions:

Source gases: $CCl_4$-80% $N_2$;
Pressure: 2.66 Pa;
Substrate temperature: 350° C.; and
Etching mask: $SiO_2$;

As is seen from FIG. 2, according to the above conditions of RIE, the layers of Ti and TiN 14, 16 can be etched at the same time when the layer of Cu 18 is etched.

Figure 3:
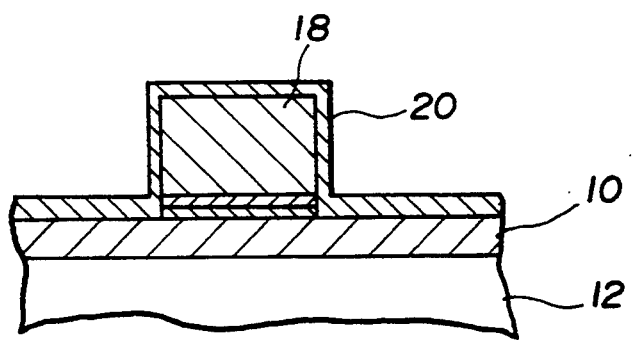
Figure 4:
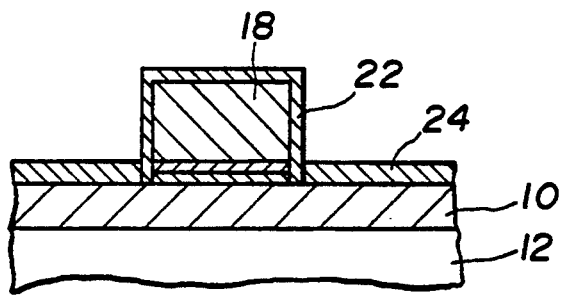

Then, as is seen from FIG. 3, a layer of Al 20 is deposited on the whole surface of the wafer by a DC magnetron sputtering method so as to have a thickness of 40 nm. Then, a so-called lamp annealing is conducted with an infrared lamp on the wafer at a temperature of 450° C. for 60 sec. With this, as is seen from FIG. 4, the layer of Al 20 is transformed into a layer of alloy containing Al and Cu 22 by the reaction of Al of the layer 20 and Cu of the layer 18. In fact, according to the above-mentioned conditions, the Cu-Al alloy layer 22 has a thickness of about 30 nm and contains Cu and Al in the molecular ratio of Al/Cu of 2. The Cu-Al alloy having this molecular ratio will be represented hereinafter by $CuAl_2$. In other words, with this ratio, the alloy layer contains 33.3 mol. % of Cu and 66.7 mol. % of Al, or 54.1 wt. % of Cu and 45.9 wt. % of Al.

Figure 7:
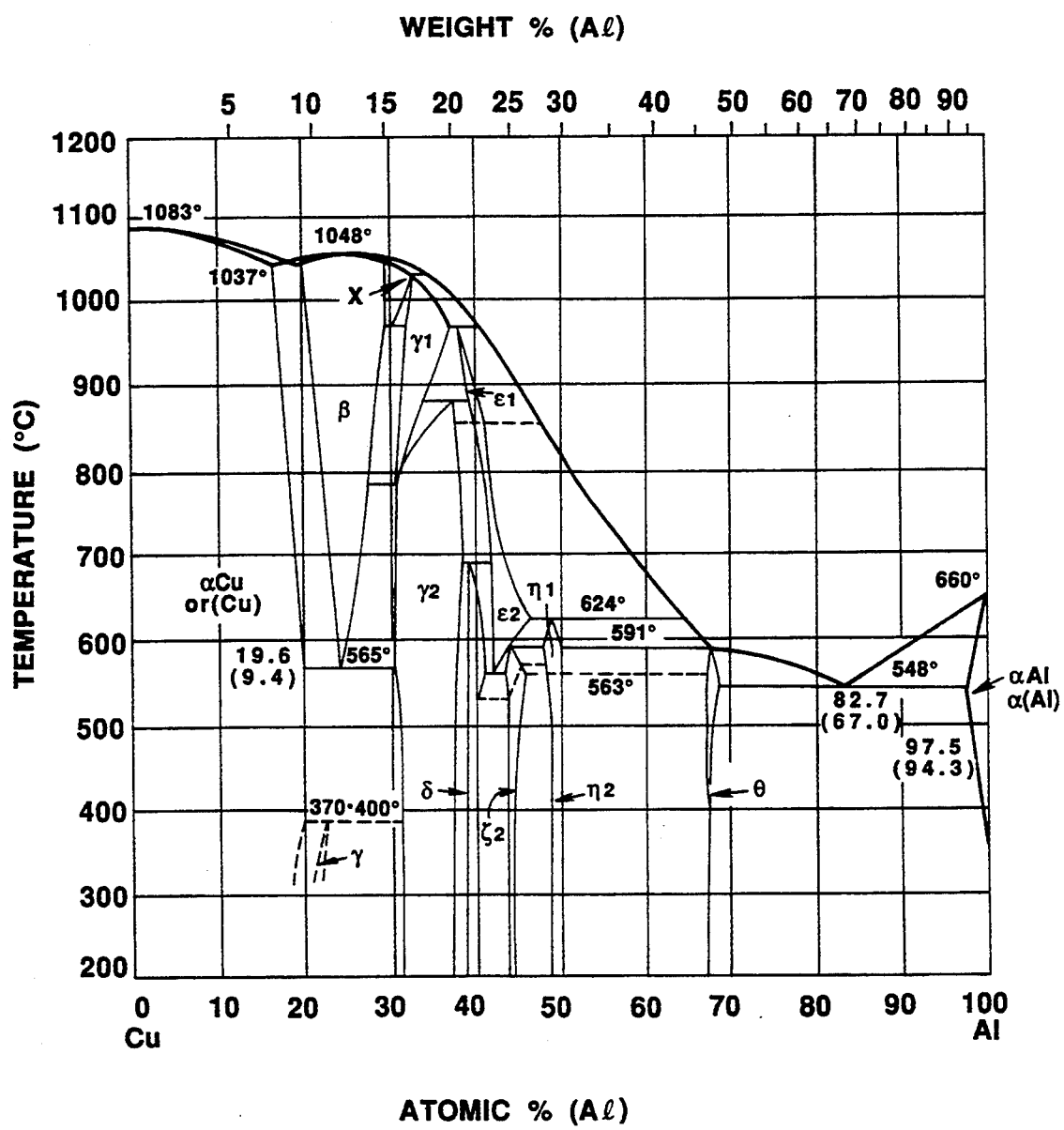
FIG. 7 is a diagram showing aluminum-copper equilibrium.

It is understood from FIG. 7 that the alloy of $CuAl_2$ containing 66.7 mol or atomic % of Al, which falls within θ-phase of the diagram, is stable at a temperature below 200° C.

It is preferable to conduct the lamp annealing at a temperature ranging from 300° C. to 550° C. If the temperature is below 300° C., Cu does not sufficiently react with Al. If the temperature exceeds 550° C., the alloy of CuAl$_2$ may take the form of liquid, thereby not permitting the layer of Cu 18 to be uniformly covered with the Cu-Al alloy.

Figure 5:
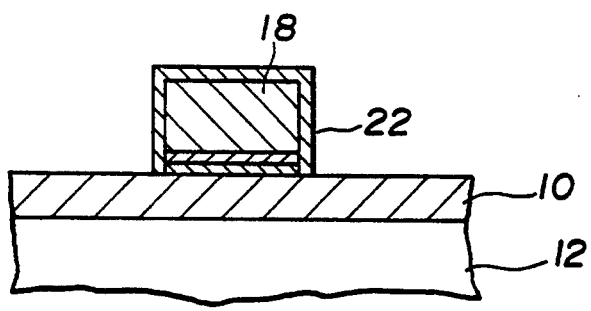
Figure 6:
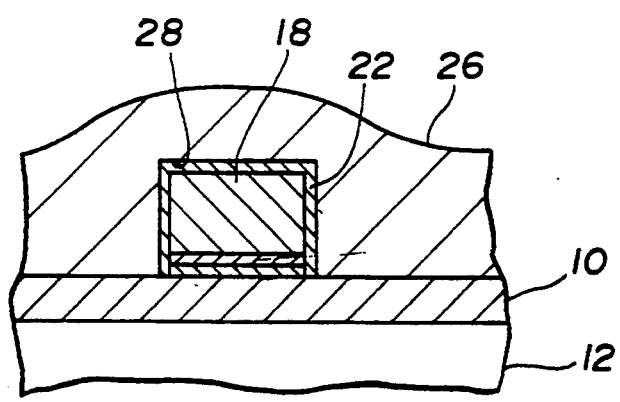

After the lamp annealing, as is seen from FIG. 5, the layer of Al which has not been transformed into the Cu-Al alloy which is designated by numeral 24 is removed by a phosphoric acid solution heated at a temperature of 50° C. Then, as is seen from FIG. 6, a second insulating layer of SOG (spin-on-glass) 26 is formed on the whole surface of the wafer in accordance with the following method.

Firstly, a SOG solution which is an organic solvent dissolving therein a silicon compound and an additive agent is coated on the whole surface of the wafer by a spin coating method. Then, the coated wafer is cured at a temperature of 450° C., so as to form the second insulating layer of SOG 26 which consists essentially of SiO$_2$.

Figure 8:
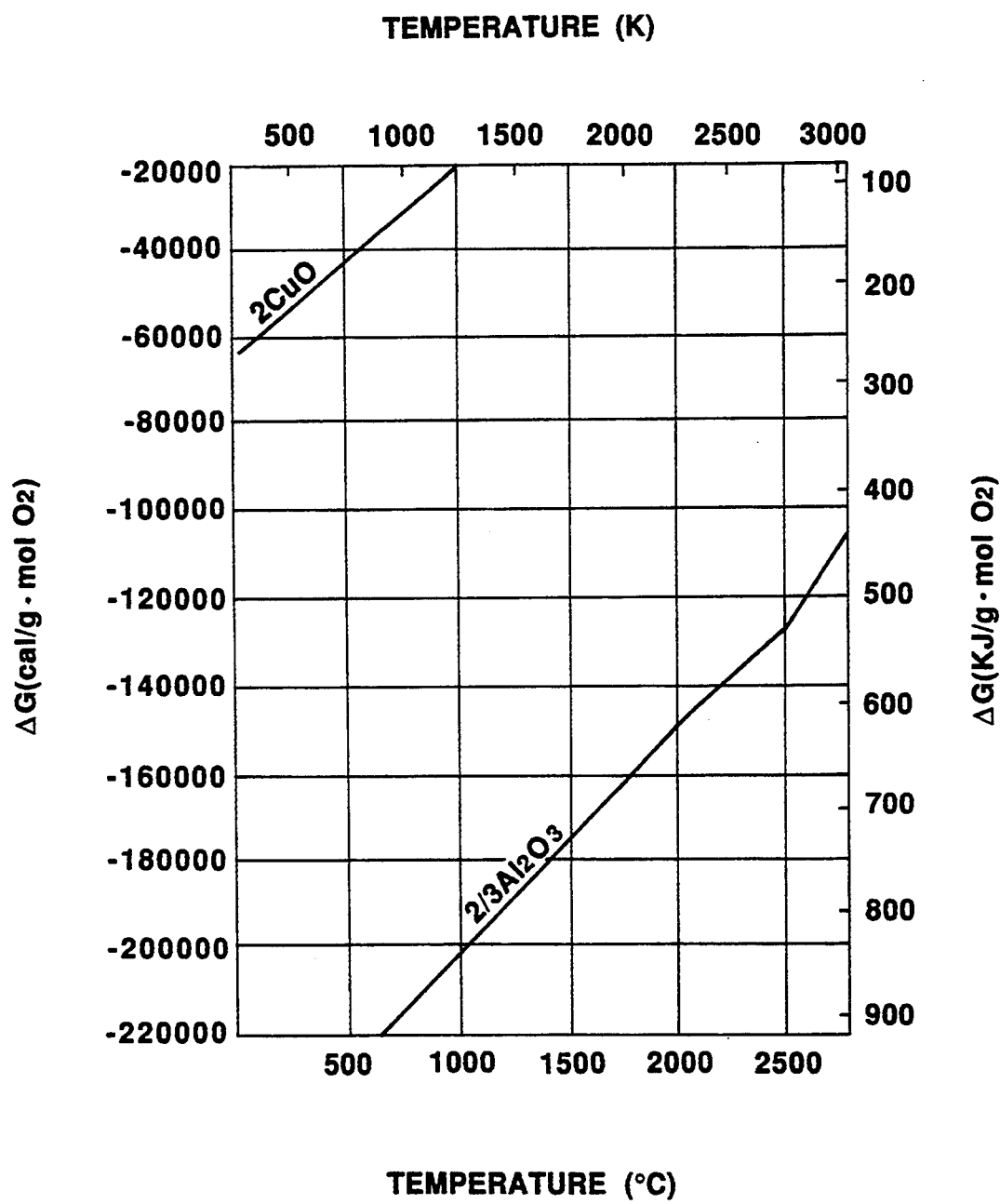
FIG. 8 is a graph showing the relationship between temperature and oxide formation free energy with respect to copper and aluminum.

Referring to FIG. 8, it should be noted that Al$_2$O$_3$ formation free energy is much lower than CuO formation free energy. That is, when Al and Cu are contacted with oxygen, Al$_2$O$_3$ is formed, and not CuO. Therefore, a layer of Al$_2$O$_3$ 28 is formed on the outer surface of the Cu-Al alloy layer 22 by the reaction of Al of the Cu-Al alloy layer 22 and oxygen of the SOG insulating layer 26 in accordance with the following reaction:

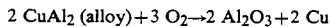

2 CuAl$_2$ (alloy) + 3 O$_2$ → 2 Al$_2$O$_3$ + 2 Cu

The Cu-Al alloy layer 22 is covered with this Al$_2$O$_3$ layer 28 serving as a barrier to suppress oxidation of Cu. Therefore, the increase of electrical resistance of Cu interconnection structure can be substantially suppressed. Even when heat treatments are conducted several times on the wafer after the formation of the second insulating layer 26 thereon, Cu of the patterned Cu layer would not be oxidized due to the thermal stability of Al$_2$O$_3$.

Thus, it is most preferable to form the alloy of CuAl$_2$ containing 45.9 wt. % of Al. However, it should be noted that, when the Cu-Al alloy containing Al ranging from about 30 to about 60 wt. % and Cu ranging from about 40 to about 70 wt. % is formed on the patterned Cu layer, the increase of electrical resistance of the Cu interconnection structure can be substantially suppressed. If the concentration of Al in the Cu-Al alloy is too low, i.e. lower than about 30 wt. %, the amount of CuO formed by the reaction of Cu and oxygen of SOG insulating layer is substantially increased, thereby increasing electrical resistance of the Cu interconnection structure. If the concentration of Al in the Cu-Al alloy is too high, i.e. higher than about 60 wt. %, Al atom diffuses into the patterned Cu layer and reacts with Cu, thereby increasing electrical resistance of the Cu interconnection structure.

A method of preparing copper interconnection structure according to a second embodiment of the present invention, which is a modification of that of the first embodiment, will be described in the following. The description of steps which are the same as those of the first embodiment are omitted.

Instead of forming the second insulating layer of SOG, a SiO$_2$ insulating layer is formed on the whole surface of the wafer by a plasma CVD method in accordance with the following conditions:

Temperature: 380° C.;
Pressure: 173 Pa; and
Source gases and their flow rates: SiH$_4$ (500 SCCM), O$_2$ (120 SCCM), and He (3800 SCCM).

As the same as the first embodiment, a layer of Al$_2$O$_3$ is formed on the outer surface of the Cu-Al alloy layer by the reaction of Al of the Cu-Al alloy layer and oxygen of the second insulating layer of SiO$_2$, thereby suppressing oxidation of Cu.

A method of preparing copper interconnection structure according to a third embodiment of the present invention, which is a modification of that of the first embodiment, will be described in the following. The description of steps which are the same as those of the first embodiment are omitted.

A layer of Al is deposited on the patterned layer of Cu by a selective growth or vacuum CVD method (cold wall type) in accordance with the following conditions, so as to have a thickness of 40 nm.

Reaction gas: dimethylaluminumhydride;
Partial pressure: 0.4 Pa;
Carrier gas: H2;
Total pressure: 266 Pa; and
Temperature: 270° C.

After the deposition of the Al layer, the lamp annealing is conducted on the wafer with an infrared lamp at a temperature of 450° C. for 60 sec, so as to form an Cu-Al alloy layer having a thickness of about 30 nm. Then, similar to the second embodiment, a second insulating layer of SiO$_2$ is formed on the wafer so as to have a thickness of, for example, 70 nm.

It should be noted, as the same as the first and second embodiments, that a layer of Al$_2$O$_3$ is formed on the outer surface of the Cu-Al alloy layer by the reaction of Al of the alloy layer and oxygen of the second insulating layer of SiO$_2$, thereby suppressing oxidation of Cu.

What is claimed is:

1. An electrical interconnection structure comprising:
   a substrate layer;
   a Cu layer being deposited on said substrate layer and having the shape of an interconnection pattern; and
   means for suppressing oxidation of the Cu layer, said means being an aluminum-copper alloy layer covering said Cu layer and having a thickness less than 1000 Å.

2. An electrical interconnection structure according to claim 1, wherein an insulating layer containing SiO$_2$ is deposited on said alloy layer.

3. An electrical interconnection structure according to claim 1, wherein said alloy layer comprises CuAl$_2$.

4. An electrical interconnection structure according to claim 1, which includes a Al$_2$O$_3$ layer on the aluminum-copper alloy layer.

5. A device comprising:
   a substrate;
   an insulating layer on a surface of the substrate, said layer having at least one contact hole to expose a portion of the surface of the substrate;
   an interconnection layer formed on the insulating layer to contact the exposed portion of the substrate through the contact hole, said interconnection layer comprising a copper layer covered with an aluminum oxide layer converted from a copper aluminum alloy layer formed on the copper layer; and an oxygen-containing insulating layer covering the interconnection layer.

6. A device according to claim 5, wherein said interconnection layer has a barrier layer under the copper layer to prevent a reaction between the substrate and copper layer.

7. A device according to claim 5, wherein said interconnection layer has a conductive layer under the copper layer to form an ohmic contact with the substrate.

8. A device according to claim 5, wherein said interconnection layer has an aluminum-copper alloy layer between the aluminum oxide and copper layers.

* * * * *